United States Patent
Herman et al.

(10) Patent No.: US 7,329,915 B2
(45) Date of Patent: Feb. 12, 2008

(54) RECTIFYING CONTACT TO AN N-TYPE OXIDE MATERIAL OR A SUBSTANTIALLY INSULATING OXIDE MATERIAL

(75) Inventors: Gregory Herman, Albany, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/283,914

(22) Filed: Nov. 21, 2005

(65) Prior Publication Data
US 2007/0114528 A1   May 24, 2007

(51) Int. Cl.
*H01L 29/76* (2006.01)
(52) U.S. Cl. .................. 257/288; 257/43; 257/458; 257/46; 257/E21.35; 257/E21.351
(58) Field of Classification Search ............ None
See application file for complete search history.

(56) References Cited

U.S. PATENT DOCUMENTS

| | | | |
|---|---|---|---|
| 6,057,561 A | 5/2000 | Kawasaki et al. | |
| 6,258,702 B1 | 7/2001 | Nakagawa et al. | |
| 6,294,274 B1 | 9/2001 | Kawazoe et al. | |
| 6,444,296 B1 | 9/2002 | Sasaki et al. | |
| 6,696,700 B2 | 2/2004 | Gong et al. | |
| 6,936,865 B2 | 8/2005 | Tonooka | |
| 2004/0232427 A1* | 11/2004 | Burgener et al. | 257/78 |
| 2005/0130844 A1 | 6/2005 | Iwata | |

OTHER PUBLICATIONS

Kamiya, T. et al., Electrical Properties and Structure of p-Type Amorphous Oxide Semiconductor xZnO-Rh2O3, Advanced Functional Materials, 2005, 15, pp. 968-974.
Kudo, A. et al., SrCu2O2: A p-Type Conductive Oxide with Wide Band Gap, Applied Physics Letters, vol. 73, No. 2, Jul. 13, 1998, pp. 220-222.
Duan, N. et al., Transparent p-Type Conducting CuScO2+x Films, Applied Physics Letters, vol. 77, No. 9, Aug. 28, 2000, pp. 1325-1326.
Ohta, H. et al.,Fab. & Photoresponse of a pn-Heterojunction Diode Composed of Transp. Ox Semicon, p-NiO and n-ZnO,Appl.Phys Lett., vol. 83, No. 5, Aug. 4, 2003, pp. 1029-1031.
Ueda, K. et al.,Epitaxial Growth of Transp. p-Type Cond. CuGaO2 Thin Films on Sapphire (001) Sub. by Pulsed Laser Dep,J. Appl. Phys,vol. 89,No. 3,Feb. 1, 2001,pp. 1790-1793.
Ohta,H. et al,Fab. & Characterization of UV-Emitting Diodes Composed of Transp. p-n Heterojunction,p-SrCu2O2 and n-ZnO,J. Appl. Phys. vol. 89,No. 10,May 15, 2001,pp. 5720-5725.

(Continued)

*Primary Examiner*—Sue A. Purvis
*Assistant Examiner*—Scott R Wilson

(57) ABSTRACT

A rectifying contact to an n-type oxide material and/or a substantially insulating oxide material includes a p-type oxide material. The p-type oxide material includes a copper species and a metal species, each of which are present in an amount ranging from about 10 atomic % to about 90 atomic % of total metal in the p-type oxide material. The metal species is selected from tin, zinc, and combinations thereof.

35 Claims, 4 Drawing Sheets

OTHER PUBLICATIONS

Hoffman, R. et al., Electrical Characterization of Transparent p-i-n Heterojunction Diodes, J. Appl. Phys. vol. 90, No. 11, Dec. 1, 2001, pp. 5763-5767.

Hosono, H. et al., Near-UV Emitting Diodes Based on Transparent p-n Junction Composed of Heteroepitaxially Grown p-SrCu2O2 and n-Zno, J.Cryst.Growth, 237-239 (2002), pp. 496-502.

Tsukazaki, A. et al., Blue Light-Emitting Diode Based on ZnO, Japanese Journal of Applied Physics, vol. 44, No. 21, 2005, pp. L643-L645.

Jimenez-Gonzalez, A. E., Modification of ZnO Thin Films by Ni, Cu and Cd Doping, Journal of Solid State Chemistry, 128, Article No. SC967166. (1997), pp. 176-180.

Kawazoe, H. et al., Transparent p-Type Conducting Oxides: Design and Fabrication of p-n Heterojunctions, Mater. Res. Soc. Bulletin, Aug. 2000, pp. 28-36.

Kawazoe, H. et al., P-Type Electrical Conduction in Transparent Thin Films of CuAlO2, Nature, vol. 389, Oct. 30, 1997, pp. 939-942.

Zhang, D.K. et al., The Electrical Properties and The Interfaces of Cu2O/ZnO/ITO p-i-n Heterojunction, Physica B 351 (2004) pp. 178-183.

Look, D.C. et al., The Future of ZnO Light Emitters, Phys. Stat. Sol. (a) 201, No. 10, (2004) pp. 2203-2212.

Hartmann, A. et al., Influence of Copper Dopants on the Resistivity of ZnO Films, Surface and Interface Analysis, vol. 24 (1996), pp. 671-674.

Yanagi, H. et al., Fab. of All Oxide Transparent p-n Homojunction Using Bipolar CuInO2 Semiconducting Oxide With Delafossite Structure, Solid State Comm.121(2002), pp. 15-18.

Tate, J. et al., p-Type Oxides For Use In Transparent Diodes, Thin Solid Films 411 (2002), pp. 119-124.

Ohta, H. et al., UV-Detector Based on pn-Heterojunction Diode Composed of Transparent Oxide Semiconductors, p-NiO/n-ZnO, Thin Solid Films 445 (2003), pp. 317-321.

Tonooka, K. et al., Photovoltaic Effect Observed in Transparent p-n Heterojunctions Based On Oxide Semiconductors, Thin Solid Films 445 (2003), pp. 327-331.

Nagarajan et al, "New CUM2/3SB1/3O2 and AGM2/3SB1/3O2 Compounds with the Delafossite Structure", Solid State Sciences, V.4(6) Jun. 2002, pp. 787-792.

Gouega et al, "Study of the Electrode Gap Influence on Electrode Erosion Under the Action of an Electric Arc", EP Phys. Jrnl Appl Physics, V 11(2) 2000.

Tonooka et al, "Photovoltaic Effect Observed in Transparent p-n Heterojunctions Based on Oxide Semiconductors", Prep and Char Elsevier Sequoia, V. 445(2), 2003.

Gall et al, "Synthesis, Microstructure, and Electrical Properties of the Delafossite Compound CuGaO2", Jrnl of Alloys and Compounds, V. 391(1-2), 2005.

\* cited by examiner

RECTIFYING CONTACT TO AN N-TYPE OXIDE MATERIAL OR A SUBSTANTIALLY INSULATING OXIDE MATERIAL

BACKGROUND

The present disclosure relates generally to rectifying contacts to an n-type oxide material or a substantially insulating oxide material.

Many electronic devices are based on oxide semiconductors. Such devices may include thin-film transistors with oxide semiconductor channel layers or diodes incorporating oxide semiconductor materials.

The formation of high quality rectifying contacts to oxide semiconductors may, in some instances, be difficult. One method for forming a rectifying contact includes doping a material n-type and p-type in adjacent regions to form a diode. This method may, in some instances, not be suitable, as many oxide semiconductors have a tendency toward either n-type or p-type conductivity, with the opposite conductivity being difficult to attain. Many oxides (e.g., ZnO, $In_2O_3$, and $SnO_2$) tend strongly toward n-type, and their electron affinity is relatively large (~4-5 eV). As such, a p-type material or metal suitable for formation of a rectifying contact should have a relatively large work function and/or suitable interface properties so as to provide a sufficient barrier to charge injection into the n-type layer when the rectifying contact is biased in the negative direction (i.e., with a relative positive potential applied to the n-type layer). Where a rectifying contact may be obtained, complex surface preparation and low-energy deposition processes may be necessary.

As such, it would be desirable to provide a p-type material that is capable of forming a rectifying contact to n-type oxides.

SUMMARY

A rectifying contact to an n-type oxide material and/or a substantially insulating oxide material is disclosed. The rectifying contact includes a p-type oxide material. The p-type oxide material includes a copper species and a metal species, each of which are present in an amount ranging from about 10 atomic % to about 90 atomic % of total metal in the p-type oxide material. The metal species is selected from tin, zinc, and combinations thereof.

BRIEF DESCRIPTION OF THE DRAWINGS

Objects, features and advantages will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION

Several copper-based p-type oxides are known, including $SrCu_2O_2$, $CuAlO_2$, $CuGaO_2$, $CuInO_2$, and $CuYO_2$. Some of these p-type oxides are capable of forming rectifying contacts to n-type oxides, such as, for example zinc oxide. The fabrication of rectifying contacts based on these materials generally includes targeting a specific composition that corresponds to a specific crystal structure (e.g., $Cu:Al:O_2$ 1:1:2 (atomic) to provide $CuAlO_2$) and metal oxidation state (e.g., Cu(I) to provide $CuAlO_2$). Targeting such a specific composition generally requires precisely controlled and developed process conditions.

Embodiments of the rectifying contacts disclosed herein, which are based on copper zinc oxide and/or copper tin oxide materials, do not necessarily correspond to a particular chemical compound and/or crystalline phase; rather they may include substantially amorphous and/or mixed-phase crystalline films. As such, embodiments of the p-type oxide materials discussed in further detail below are fabricated with relatively simple deposition and processing techniques, without complicated surface preparation and/or cleaning processes. Still further, embodiments of the p-type oxide materials may advantageously provide rectifying contacts for various oxide materials, including n-type materials and substantially insulating oxide materials.

Figure 1A:
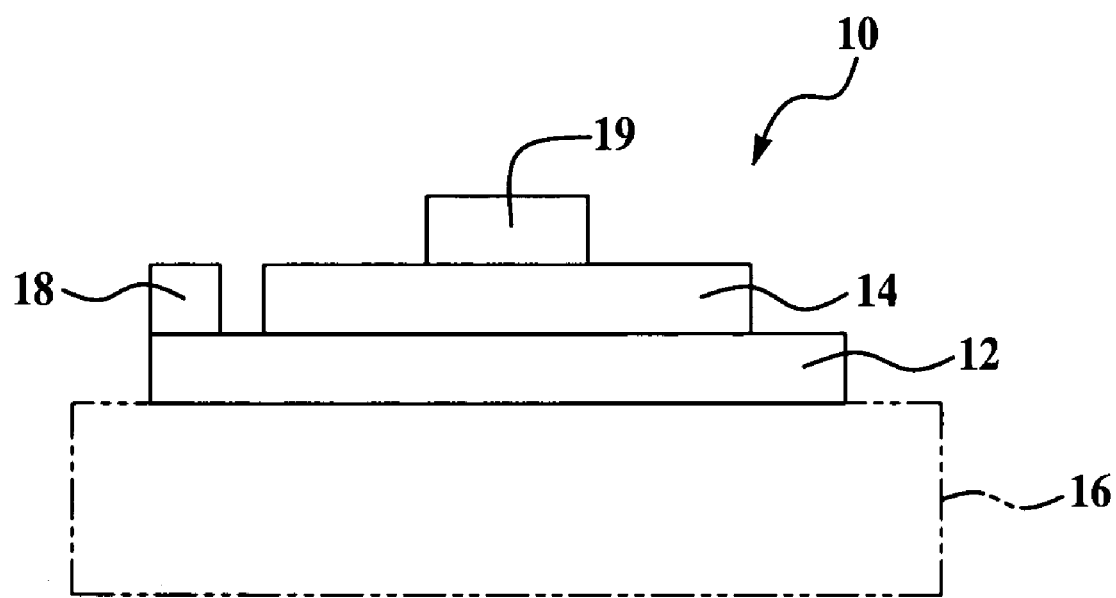
FIG. 1A is a schematic view of an embodiment of a diode.
Figure 1B:
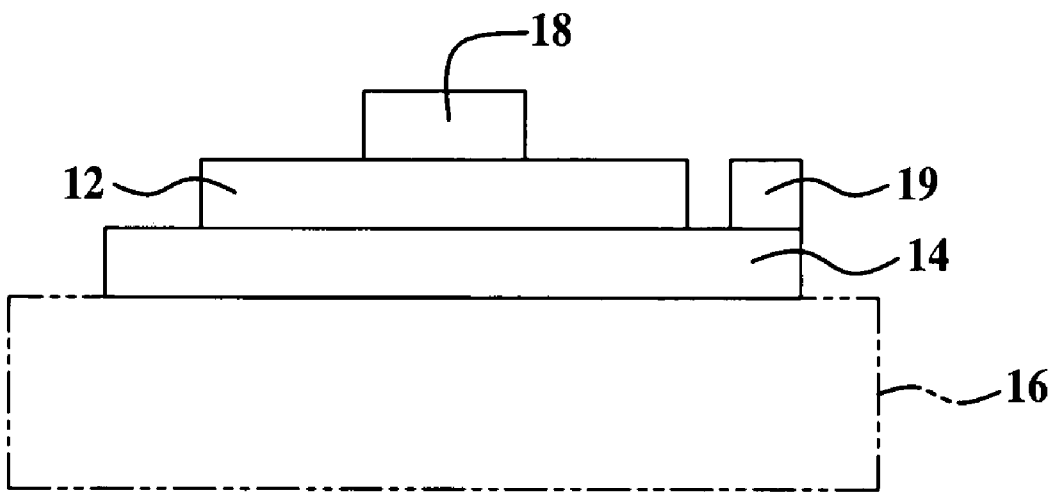
FIG. 1B is a schematic view of an alternate embodiment of a diode.

Referring now to FIGS. 1A and 1B, embodiments of diodes 10, each including an embodiment of the p-type oxide material 12, are shown. Generally, the diodes 10 include an n-type (i.e., a material in which electrons are the majority carrier type) oxide material 14 electrically coupled to a p-type (i.e., a material in which holes are the majority carrier type) oxide material 12. In each of these embodiments, a p-n junction is formed between the p-type oxide material 12 and the n-type oxide material 14. It is to be understood that, in these embodiments, the p-type oxide material 12 provides a rectifying contact to the n-type oxide material 14.

The p-type oxide material 12 and the n-type oxide material 14 may be established on a suitable substrate 16 in any suitable configuration (different embodiments of which are shown in FIGS. 1A and 1B). Non-limitative examples of suitable substrate materials include glass, silicon, quartz, sapphire, PLEXIGLAS (which is commercially available from Rohm and Haas Co., located in Philadelphia, Pa.), polyamides, metals (a non-limitative example of which includes stainless steel), polyarylates (PAR), polyimides (PI), polyestersulfones (PES), polyethylene naphthalates (PEN), polyethylene terephthalates (PET), polyolefins, and/or combinations thereof.

The p-type oxide material 12 includes a copper species present in an amount ranging from about 10 atomic % to about 90 atomic % of total metal in the p-type oxide material 12. Non-limitative examples of the copper species are copper I oxide and copper II oxide.

The p-type oxide material 12 also includes a metal species present in an amount ranging from about 10 atomic % to about 90 atomic % of total metal in the p-type oxide material 12. The metal species may include a species of tin, zinc, and/or combinations thereof. Specific non-limitative examples of the metal species include tin oxide, zinc oxide, and/or combinations thereof.

Some non-limitative examples of the p-type oxide materials 12 include copper zinc oxide, copper tin oxide, and copper zinc tin oxide. In an embodiment, the p-type oxide material may also include gallium, indium, and/or combinations thereof. Examples of the p-type oxide material 12 including indium and/or gallium include, but are not limited to copper zinc indium oxide, copper zinc gallium oxide, copper zinc gallium indium oxide, copper tin indium oxide, copper tin gallium oxide, copper tin gallium indium oxide, copper zinc tin gallium oxide, copper zinc tin indium oxide, copper zinc tin gallium indium oxide, or the like.

As defined herein, it is to be understood that the term copper/metal "species" may encompass an oxide of the corresponding metal. For example, "copper species" may encompass copper oxide materials; and "metal species" may encompass metal oxide materials.

It is to be understood that the combination of the copper species and the metal species may be formulated so that the p-type oxide material 12 is substantially homogeneous, substantially heterogeneous, or so that portions of the material 12 are homogeneous while other portions are heterogeneous.

In one non-limitative example, the p-type oxide material 12 includes about 50 atomic % of the copper species and about 50 atomic % of the metal species. In another non-limitative example, the p-type oxide material 12 includes from about 25 atomic % to about 75 atomic % of the copper species and from about 25 atomic % to about 75 atomic % of the metal species.

Embodiments of the p-type oxide material 12 are adapted to provide rectifying contacts to suitable oxide semiconductors, including the n-type oxide materials 14. Non-limitative examples of n-type oxide materials 14 include oxides of zinc, tin, indium, gallium, and/or combinations thereof. Some specific examples of the n-type oxide materials 14 include, but are not limited to zinc oxide, tin oxide, indium oxide, zinc tin oxide, zinc indium oxide, gallium indium oxide, zinc indium gallium oxide, zinc tin gallium oxide, and/or the like, and/or combinations thereof.

The p-type oxide materials 12 disclosed herein may be substantially amorphous materials and/or mixed-phase crystalline materials.

The p-type oxide materials 12 disclosed herein may also be at least semi-transparent. When the materials are operatively disposed in a diode 10, it is to be understood that the transparency of the material may be increased by decreasing the thickness of the established material.

The diode 10 may also include a contact 18, 19 in electrical contact with one of the other elements 12, 14 in the device 10. Examples of suitable contacts 18 for the p-type oxide material 12 include, but are not limited to high-work function metals (non-limitative examples of which include gold, iridium, nickel, palladium, platinum, rhenium, rhodium, or combinations thereof), p-type conductive oxides (non-limitative examples of which include $CuAlO_2$, $CuGaO_2$, $CuYO_2$, $SrCu_2O_2$, $Cu_2O$), sulfides (a non-limitative example of which includes $BaCu_2S_2$), halides (a non-limitative example of which includes BaCuSF), or combinations thereof. Examples of suitable contacts 19 for the n-type oxide material 14 include, but are not limited to n-type conductive oxides (non-limitative examples of which include ZnO, $In_2O_3$, indium tin oxide (ITO), $SnO_2$, or the like), metals (non-limitative examples of which include aluminum, silver, chromium, titanium, or the like), or combinations thereof. In an embodiment, each of the contacts 18, 19 has a thickness of about 100 nm.

Figure 2:
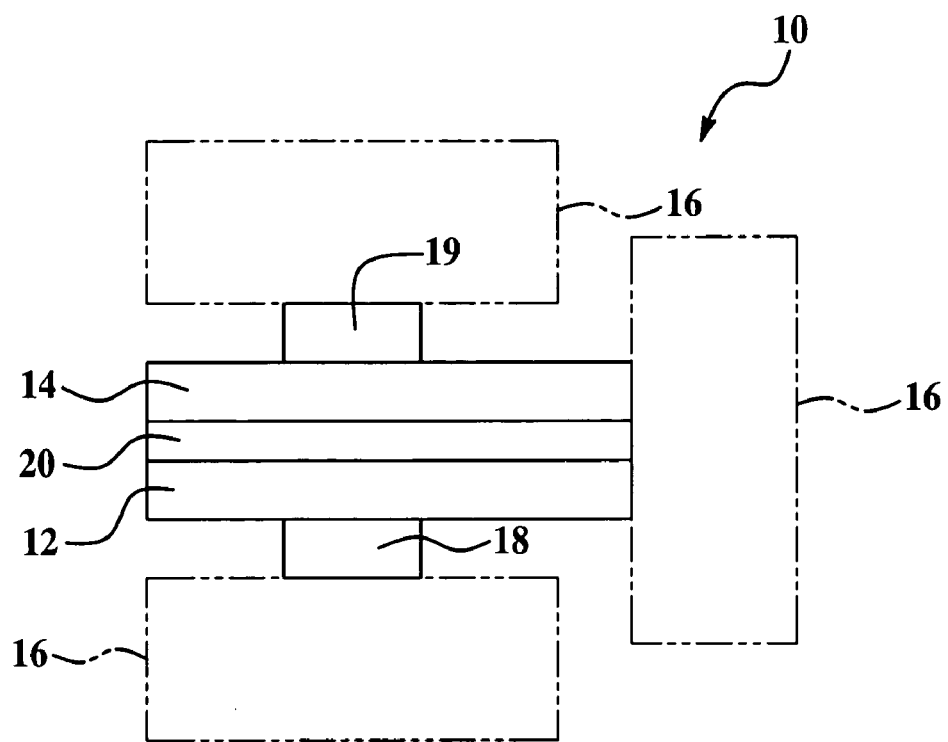
FIG. 2 is a schematic view of an embodiment of a diode including a substantially insulating oxide material.

Referring now to FIG. 2, another embodiment of the diode 10 includes a substantially insulating layer 20 positioned between the p-type and n-type oxide materials 12, 14, respectively. In this embodiment, a p-i-n junction is formed in the diode 10, and the p-type oxide material 12 provides a rectifying contact to the substantially insulating layer 20.

If desirable, the embodiment of the diode 10 shown in FIG. 2 may be established on a substrate 16. It is to be understood that the substrate 16 may be established in contact with either of the two contacts 18, 19 or with one or more of the materials 12, 20, 14.

Non-limitative examples of the substantially insulating oxide material 20 include zinc tin oxide, zinc indium oxide, zinc oxide, zinc gallium oxide, zinc indium gallium oxide, indium gallium oxide, and/or the like, and/or combinations thereof.

Acting as a rectifying contact to either an n-type oxide material 14 (FIGS. 1A and 1B) and/or to a substantially insulating oxide material 20 (FIG. 2), the p-type oxide material 12 may provide a rectifying contact which exhibits a forward-to-reverse current ratio greater than about 10. In another embodiment, the rectifying contact may exhibit a forward-to-reverse current ratio equal to or greater than about 100. In still another embodiment, the rectifying contact may exhibit a forward-to-reverse current ratio greater than about 1000.

Methods for forming the diode(s) 10 include establishing the p-type oxide material 12 in electrical contact with the n-type oxide material 14. It is to be understood that the materials 12, 14 may be established on a substrate 16 in any suitable order and/or arrangement (e.g., vertical to the substrate surface, horizontal to the substrate surface, angled (at any desired angle) with respect to the substrate surface etc.). Furthermore, in an embodiment in which the diode 10 is established on the substrate 16, either one or all of the materials 12, 14 may be established directly on the substrate 16. For example, the n-type oxide material 14 may be established directly on the substrate 16 (see FIG. 1B), the p-type oxide material 12 may be established directly on the substrate 16 (see FIG. 1A), one of the contacts 18, 19 may be established directly on the substrate 18 (see FIG. 2), or both the n-type and p-type materials 14, 12 may be established directly on the substrate 16 (see FIG. 2).

Further, the substantially insulating layer 20 may be established between the p-type oxide material 12 and the n-type oxide material 14, and a contact 18, 19 may be respectively established in electrical contact with the p-type oxide material 12 and the n-type oxide material 14.

In an embodiment, establishing the materials 12, 14 is accomplished by low temperature deposition techniques and low temperature post-processing techniques. The materials 12, 14 may be established via sputter deposition techniques at ambient temperatures. In other embodiments, the materials 12, 14 may be established via evaporation (e.g., thermal, e-beam, or the like), physical vapor deposition (PVD) (e.g., dc reactive sputtering, rf magnetron sputtering, ion beam sputtering, or the like), chemical vapor deposition (CVD), atomic layer deposition (ALD), pulsed laser deposition, spin coating, spray coating, dip coating, chemical bath deposition, ink-jet printing, gravure printing, liquid electro-photography, dry electro-photography, or the like. It is to be understood that the p-type oxide material 12, that is capable of providing a rectifying contact to an n-type oxide material 14 and/or a substantially insulating oxide material 20, may be obtained without relatively complicated surface preparation, relatively expensive single crystal substrates, and/or relatively complicated cleaning processes.

It is to be understood that the contacts 18, 19 may be established via any suitable technique, including, but not limited to dc sputter deposition.

In embodiments of the method, the p-type oxide material 12, the n-type oxide material 14, and the optional substantially insulating layer 20 may be established having a thickness ranging from about 10 nm to about 1000 nm. In another embodiment, the thickness ranges from about 150 nm to about 200 nm.

To further illustrate embodiment(s) of the present disclosure, the following examples are given. It is to be understood that these examples are provided for illustrative purposes and are not to be construed as limiting the scope of embodiment(s) of the present disclosure.

EXAMPLE 1

A p-n diode structure was formed with a copper zinc oxide p-type oxide material and a zinc indium oxide n-type oxide material. An indium tin oxide (ITO, acting as a contact for the n-type oxide material) coated glass was used as the substrate. A 150 nm thick zinc indium oxide (ZIO) layer was sputter deposited from a $ZnO/In_2O_3$ (1:2 molar ratio) target through a shadow mask at ambient temperature on the ITO layer of the substrate. The ZIO acted as an n-type semiconductor. It is believed that good ohmic (i.e., low resistance) contact between ITO and ZIO may be formed without thermal treatments (e.g., annealing). A 150 nm thick layer of copper zinc oxide (CZO) was sputter deposited from a $Cu_2O/ZnO$ (1:1 molar ratio) target at ambient temperature on the ZIO layer to form the p-type oxide material. A gold contact was deposited on top of the CZO to form the device.

Figure 3:
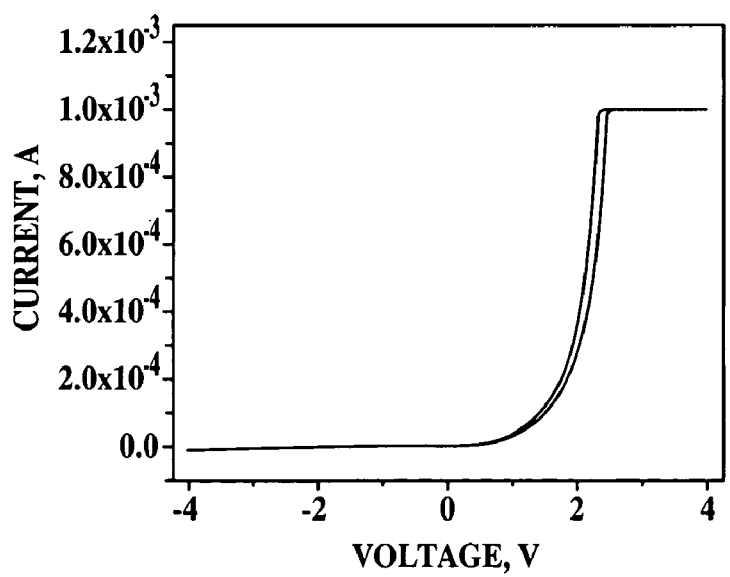
FIG. 3 is a graph depicting current vs. voltage for a diode containing a copper zinc oxide p-type oxide material.
Figure 4:
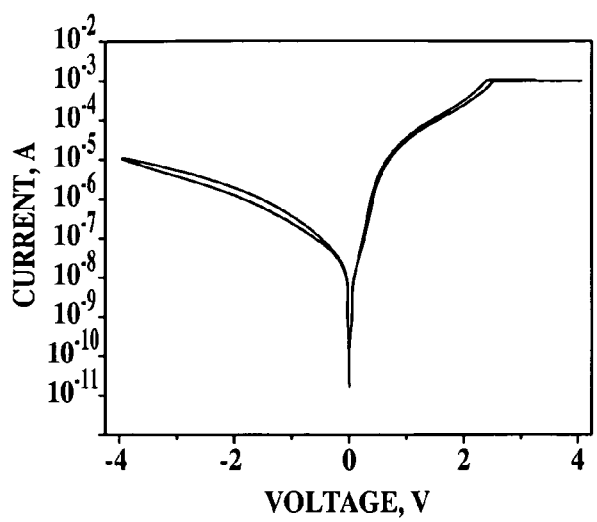
FIG. 4 is a graph depicting current vs. voltage for a diode containing a copper zinc oxide p-type oxide material.

FIGS. 3 and 4 depict graphs of current vs. voltage for the p-n diode structure formed. The current vs. voltage relationship is plotted as linear-linear plot and log-linear plot for FIGS. 3 and 4, respectively. The voltage reference used here assigns the p-type oxide material as the positive terminal. The data was obtained by scanning from negative voltage to positive voltage, and then back down to negative voltage. The data is plotted for both directions of the measurement sweep, and very little hysteresis is observed. Clear rectification in the device is observed where the $I_{on}/I_{off}$ ratio (forward-to-reverse current ratio) at a potential of +/−2 V is over 200. The region where the current level remains constant above about 2.4 V is due to the compliance limit (1 mA) set on the test instrumentation.

Figure 5:
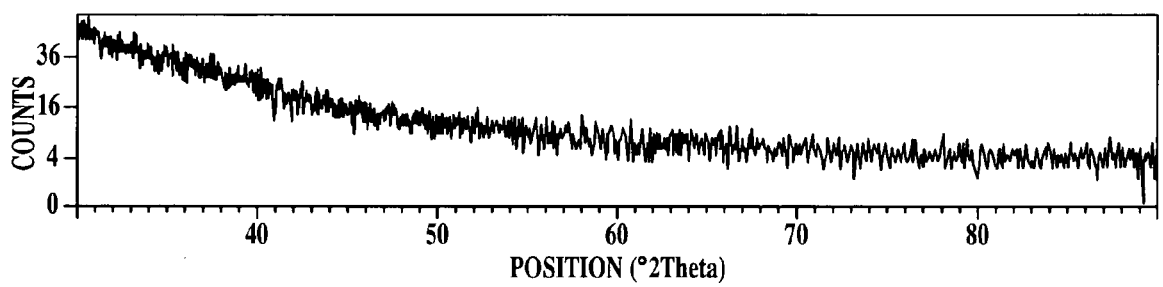
FIG. 5 is a graph depicting the x-ray diffraction analysis of a copper zinc oxide p-type material.

FIG. 5 depicts an X-ray diffraction analysis of a copper zinc oxide p-type oxide material formed using process conditions substantially the same as those used to fabricate the diode in this example. No measurable diffraction was detected, suggesting that the degree of crystallinity in the film is relatively small (i.e., the material is substantially amorphous or weakly crystalline). The X-ray diffraction analysis was performed using a Philips MRD system employing Cu Kα radiation (1.54056 angstroms). A grazing angle geometry was employed, using the following conditions:

| Parameter | Value |
|---|---|
| Incident Optic | XRM-0.5° |
| Incident Beam Mask | 10 mm |
| Detector Optic | PPC |
| Soller Slit | Diffracted Beam-0.04 Rad |
| Omega angle | 0.15° |

EXAMPLE 2

A p-i-n diode structure was formed with an indium tin oxide n-type oxide material, a zinc tin oxide substantially insulating layer, and a copper tin oxide p-type oxide material. An indium tin oxide (ITO, acting as a contact for the n-type oxide material) coated glass was used as the substrate, and the indium tin oxide acted as the n-type oxide material. A 200 nm thick zinc tin oxide (ZTO) layer was sputter deposited from a $ZnO/SnO_2$ (1:1 molar ratio) target through a shadow mask at ambient temperature on the ITO layer of the substrate, to form the substantially insulating layer of the p-i-n diode. The zinc tin oxide layer was annealed at about 300° C. A 200 nm thick layer of copper tin oxide (CTO) was sputter deposited from a $Cu_2O/SnO_2$ (1:1 molar ratio) target at ambient temperature on the ZTO layer to form the p-type oxide material. A gold contact was deposited on top of the CTO to form the device.

Figure 6:
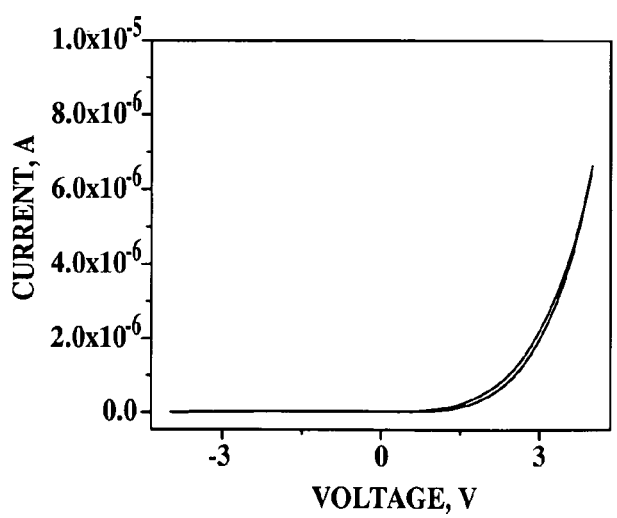
FIG. 6 is a graph depicting current vs. voltage for a diode containing a copper tin oxide p-type oxide material.
Figure 7:
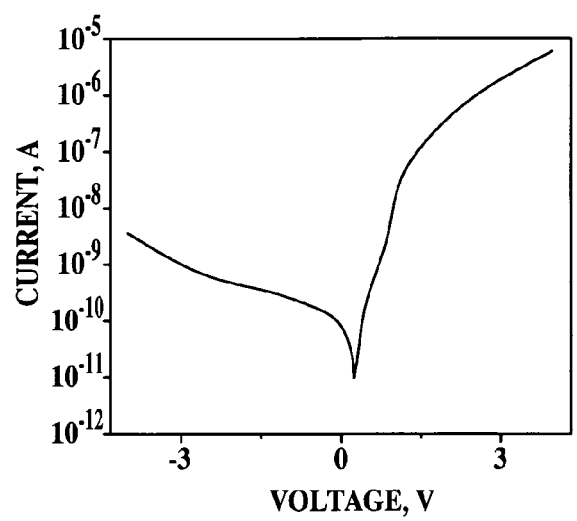
FIG. 7 is a graph depicting current vs. voltage for a diode containing a copper tin oxide p-type oxide material.

FIGS. 6 and 7 depict graphs of current vs. voltage for the diodes formed. The current vs. voltage relationship is plotted as linear-linear plot and log-linear plot for FIGS. 6 and 7, respectively. The data was obtained by scanning from negative voltage to positive voltage, and then back down to negative voltage. The data is plotted for both directions, and very little hysteresis is observed. Clear rectification in the device is observed where the $I_{on}/I_{off}$ ratio (forward-to-reverse current ratio) at a potential of +/−2V is over 800.

Figure 8:
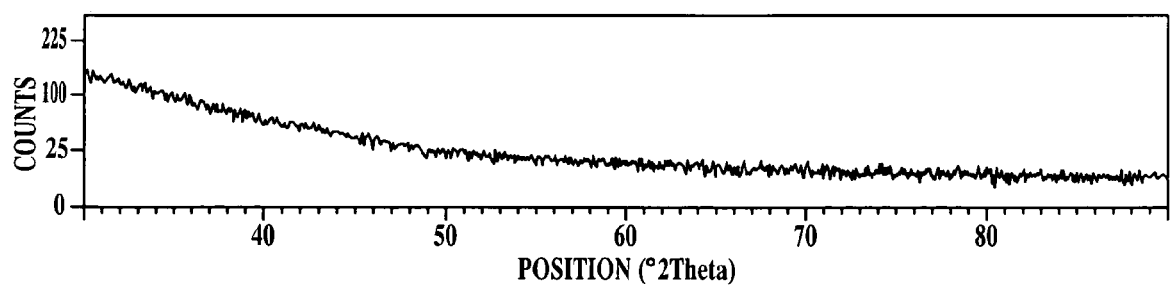
FIG. 8 is a graph depicting the x-ray diffraction analysis of a copper tin oxide p-type material.

FIG. 8 depicts an X-ray diffraction analysis of a copper tin oxide p-type oxide material formed using process conditions substantially the same as those used to fabricate the diode in this example. No measurable diffraction was detected, again suggesting that the degree of crystallinity in the films is relatively small (i.e., the material is substantially amorphous or weakly crystalline). The analysis conditions described in Example 1 were used for the X-ray diffraction of the copper tin oxide material.

Embodiment(s) of the p-type oxide material 12 described herein include, but are not limited to the following advantages. The p-type oxide materials 12 may advantageously provide rectifying contacts for various oxide materials, including n-type materials 14 and substantially insulating oxide materials 20. Furthermore, the compositions of the p-type oxide materials 12 do not necessarily correspond to a particular chemical compound and/or crystalline phase, rather they may include substantially amorphous and/or mixed-phase crystalline films. As such, the p-type oxide materials 12 may advantageously be obtained via low-temperature deposition processes and without complicated surface preparation, expensive single crystal structures, and/or complicated cleaning processes.

While several embodiments have been described in detail, it will be apparent to those skilled in the art that the disclosed embodiments may be modified. Therefore, the foregoing description is to be considered exemplary rather than limiting.

What is claimed is:

1. A rectifying contact, comprising:
    a p-type oxide material electrically coupled to at least one of an n-type oxide material or a substantially insulating oxide material, the p-type oxide material including:
    a copper species present in an amount ranging from about 25 atomic % to about 75 atomic % of total metal in the p-type oxide material; and
    a metal species present in an amount ranging from about 25 atomic % to about 75 atomic % of total metal in the p-type oxide material, the metal species selected from tin, zinc, and combinations thereof.

2. The rectifying contact as defined in claim 1 wherein the copper species is present in an amount of about 50 atomic % of total metal in the p-type oxide material, and wherein the metal species is present in an amount of about 50 atomic % of total metal in the p-type oxide material.

3. The rectifying contact as defined in claim 1 wherein the n-type oxide material is selected from an oxide of zinc, tin, indium, gallium, and combinations thereof.

4. The rectifying contact as defined in claim 3 wherein the n-type oxide material is selected from zinc oxide, tin oxide, indium oxide, zinc indium oxide, zinc tin oxide, gallium indium oxide, zinc indium gallium oxide, zinc tin gallium oxide, and combinations thereof.

5. The rectifying contact as defined in claim 1 wherein the p-type oxide material is at least semi-transparent.

6. The rectifying contact as defined in claim 1 wherein the p-type oxide material is substantially amorphous.

7. The rectifying contact as defined in claim 1 wherein the metal species is a metal oxide material.

8. The rectifying contact as defined in claim 1 wherein the p-type oxide material further includes at least one of gallium or indium.

9. The rectifying contact as defined in claim 1 wherein the n-type oxide is established in electrical contact with the p-type oxide materials, and wherein the substantially insulating oxide material is disposed between the p-type oxide material and the n-type oxide material.

10. A rectifying contact, comprising:
    a p-type oxide material electrically coupled to at least one of an n-type oxide material or a substantially insulating oxide material, the p-type oxide material including:
    a copper species present in an amount ranging from about 10 atomic % to about 90 atomic % of total metal in the p-type oxide material; and
    a metal species present in an amount ranging from about 10 atomic % to about 90 atomic % of total metal in the p-type oxide material, the metal species selected from tin, zinc, and combinations thereof;
    wherein the rectifying contact exhibits a forward-to-reverse current ratio of greater than about 10.

11. The rectifying contact as defined in claim 10 wherein the rectifying contact exhibits a forward-to-reverse current ratio of greater than about 100.

12. The rectifying contact as defined in claim 10 wherein the rectifying contact exhibits a forward-to-reverse current ratio of greater than about 1000.

13. A p-type oxide material, comprising:
    a copper species present in an amount ranging from about 25 atomic % to about 75 atomic % of total metal in the p-type oxide material; and
    a metal species selected from zinc, tin, and combinations thereof, the metal species present in an amount ranging from about 25 atomic % to about 75 atomic % of total metal in the p-type oxide material;
    wherein the p-type oxide material is adapted to provide a rectifying contact to an other oxide material.

14. The p-type oxide material as defined in claim 13 wherein the copper species is present in an amount of about 50 atomic % of total metal in the p-type oxide material, and wherein the metal species is present in an amount of about 50 atomic % of total metal in the p-type oxide material.

15. The p-type oxide material as defined in claim 13 wherein the other oxide material is selected from an oxide of zinc, tin, indium, gallium, and combinations thereof.

16. The p-type oxide material as defined in claim 15 wherein the other oxide is selected from zinc oxide, tin oxide, indium oxide, zinc indium oxide, zinc tin oxide, gallium indium oxide, zinc indium gallium oxide, zinc tin gallium oxide and combinations thereof.

17. The p-type oxide material as defined in claim 13 wherein the other oxide is selected from an n-type oxide material and a substantially insulating oxide material.

18. The p-type oxide material as defined in claim 13 wherein the p-type oxide material is at least semi-transparent.

19. The p-type oxide material as defined in claim 13 wherein the metal species is a metal oxide material.

20. A diode, comprising:
    an n-type oxide material; and
    a p-type oxide material established in electrical contact with the n-type oxide material, the p-type oxide material including a copper species present in an amount ranging from about 25 atomic % to about 75 atomic % of total metal in the p-type oxide material, and a metal species present in an amount ranging from about 25 atomic % to about 75 atomic % of total metal in the p-type oxide material, the metal species selected from zinc, tin, and combinations thereof;
    wherein the p-type oxide material is adapted to provide a rectifying contact to an other oxide material selected from the n-type oxide material and a substantially insulating oxide material.

21. The diode as defined in claim 20 wherein the p-type oxide material includes the copper species in an amount of about 50 atomic % of total metal in the p-type oxide material and the metal species in an amount of about 50 atomic % of total metal in the p-type oxide material.

22. The diode as defined in claim 20 wherein the n-type oxide material is selected from an oxide of zinc, tin, indium, gallium, and combinations thereof.

23. The diode as defined in claim 22 wherein the n-type oxide material is selected from zinc oxide, tin oxide, indium oxide, zinc indium oxide, zinc tin oxide, gallium indium oxide, zinc indium gallium oxide, zinc tin gallium oxide, and combinations thereof.

24. The diode as defined in claim 20 wherein the diode is at least semi-transparent.

25. The diode as defined in claim 20, further comprising a substrate upon which the n-type oxide material and the p-type oxide material are established.

26. The diode as defined in claim 20 wherein the metal species is a metal oxide material.

27. A diode, comprising:
    an n-type oxide material;
    a p-type oxide material established in electrical contact with the n-type oxide material, the p-type oxide material including a copper species present in an amount ranging from about 10 atomic % to about 90 atomic % of total metal in the p-type oxide material, and a metal species present in an amount ranging from about 10 atomic % to about 90 atomic % of total metal in the p-type oxide material, the metal species selected from zinc, tin, and combinations thereof; and a substantially insulating oxide material positioned between the n-type oxide material and the p-type oxide material;

wherein the p-type oxide material is adapted to provide a rectifying contact to an other oxide material selected from the n-type oxide material and the substantially insulating oxide material.

28. The diode as defined in claim 27 wherein the substantially insulating oxide material is selected from zinc tin oxide, zinc indium oxide, zinc oxide, zinc gallium oxide, zinc indium gallium oxide, indium gallium oxide, zinc tin gallium oxide, and combinations thereof.

29. A diode, comprising:

an n-type oxide material, wherein the n-type oxide material is indium tin oxide;

a p-type oxide material established in electrical contact with the n-type oxide material, the p-type oxide material including a copper species present in an amount ranging from about 10 atomic % to about 90 atomic % of total metal in the p-type oxide material, and a metal species present in an amount ranging from about 10 atomic % to about 90 atomic % of total metal in the p-type oxide material, the metal species selected from zinc, tin, and combinations thereof; and a zinc tin oxide material positioned between the indium tin oxide and the p-type oxide material;

wherein the p-type oxide material is adapted to provide a rectifying contact to an other oxide material selected from the indium tin oxide and the zinc tin oxide.

30. A diode, comprising:

an n-type oxide material; and a p-type oxide material established in electrical contact with the n-type oxide material, the p-type oxide material including a copper species present in an amount ranging from about 10 atomic % to about 90 atomic % of total metal in the p-type oxide material, and a metal species present in an amount ranging from about 10 atomic % to about 90 atomic % of total metal in the p-type oxide material, the metal species selected from zinc, tin, and combinations thereof;

wherein the p-type oxide material is adapted to provide a rectifying contact to an other oxide material selected from the n-type oxide material and a substantially insulating oxide material, and wherein the diode exhibits a forward-to-reverse current ratio greater than about 10.

31. The diode as defined in claim 30 wherein the diode exhibits a forward-to-reverse current ratio greater than about 1000.

32. A rectifying contact, comprising:

a p-type oxide material electrically coupled to an n-type oxide material, thereby forming a p-n junction, the p-type oxide material including:

a copper species present in an amount ranging from about 25 atomic % to about 75 atomic % of total metal in the p-type oxide material; and a metal species present in an amount ranging from about 25 atomic % to about 75 atomic % of total metal in the p-type oxide material, the metal species selected from tin, zinc, and combinations thereof.

33. A rectifying contact, comprising:

a p-type oxide material electrically coupled to an n-type oxide material, the p-type oxide material including:

a copper species present in an amount ranging from about 10 atomic % to about 90 atomic % of total metal in the p-type oxide material; and a metal species present in an amount ranging from about 10 atomic % to about 90 atomic % of total metal in the p-type oxide material, the metal species selected from tin, zinc, and combinations thereof; and a substantially insulating oxide material disposed between the p-type oxide material and the n-type oxide material, thereby forming a p-i-n junction.

34. A diode, comprising:

an n-type oxide material; and means for providing rectifying contacts to the n-type oxide material, the means including a copper species present in an amount ranging from about 25 atomic % to about 75 atomic % of total metal in the rectifying contacts means, and a metal species selected from zinc, tin, and combinations thereof, the metal species present in an amount ranging from about 25 atomic % to about 75 atomic % of total metal in the rectifying contacts means.

35. The diode as defined in claim 34, further comprising a substantially insulating oxide material disposed between the n-type oxide material and the means for providing rectifying contacts to the n-type oxide material.

* * * * *